US006791873B1

(12) United States Patent
Perner (10) Patent No.: US 6,791,873 B1
(45) Date of Patent: Sep. 14, 2004

(54) APPARATUS AND METHOD FOR GENERATING A WRITE CURRENT FOR A MAGNETIC MEMORY CELL

(75) Inventor: Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/658,442

(22) Filed: Sep. 8, 2003

(51) Int. Cl.[7] .............................................. G11C 11/00
(52) U.S. Cl. ...................... 365/158; 365/171; 365/173
(58) Field of Search ................................ 365/158, 171, 365/173

(56) References Cited

U.S. PATENT DOCUMENTS 6,594,191 B2 * 7/2003 Lammers et al. ........... 365/158
6,606,262 B2   8/2003 Perner

FOREIGN PATENT DOCUMENTS

JP          2003115577 A   *   4/2003   ........... H01L/43/08

* cited by examiner

Primary Examiner—Son Mai
(74) Attorney, Agent, or Firm—Brian R Short (57) ABSTRACT

The invention includes an apparatus and method for generating a write current for a magnetic memory cell. The apparatus includes a write current generator for generating a write current, the write current being magnetically coupled to the magnetic memory cell. The apparatus further includes at least one test magnetic memory cell, the write current being magnetically coupled to the at least one test magnetic memory cell. A switching response of the at least one test magnetic memory cell determines a magnitude of the write current generated by the write current generator. The method for determining a write current for a magnetic memory cell includes supplying a test write current to a test magnetic memory cell, sensing a magnetic state of the test magnetic memory cell to determine a switching response of the test magnetic memory cell, and generating the write current having a magnitude that is dependent upon the switching response.

24 Claims, 13 Drawing Sheets

```
┌─────────────────────────────────────────────────────────────┐
│   SUBTRACTING A DELTA CURRENT FROM THE EASY AXIS WRITE      │
│   CURRENT WHILE MAINTAINING THE HARD AXIS WRITE CURRENT AT  │
│                    A DEFAULT VALUE                          │
│                                                             │
│                           1010                              │
└─────────────────────────────────────────────────────────────┘
                              │
                              ▼
┌─────────────────────────────────────────────────────────────┐
│   VERIFYING THAT THE WRITE CURRENT IS STILL ADEQUATE FOR    │
│   SWITCHING THE AT LEAST ONE TEST MAGNETIC MEMORY CELL      │
│                                                             │
│                           1020                              │
└─────────────────────────────────────────────────────────────┘
                              │
                              ▼
┌─────────────────────────────────────────────────────────────┐
│   IF THE WRITE CURRENT IS NOT ADEQUATE TO SWITCH THE AT     │
│   LEAST ONE TEST MAGNETIC MEMORY CELL, THEN INCREMENTING    │
│   THE EASY AXIS WRITE CURRENT UNTIL THE WRITE CURRENT IS    │
│   ADEQUATE TO SWITCHING THE AT LEAST ONE TEST MAGNETIC      │
│                       MEMORY CELL                           │
│                           1030                              │
└─────────────────────────────────────────────────────────────┘
                              │
                              ▼
┌─────────────────────────────────────────────────────────────┐
│   SETTING THE HARD AXIS WRITE CURRENT TO THE DEFAULT VALUE, │
│   AND SETTING THE EASY AXIS WRITE CURRENT TO THE INCREMENTED│
│     EASY AXIS WRITE CURRENT VALUE PLUS THE DELTA CURRENT    │
│                                                             │
│                           1040                              │
└─────────────────────────────────────────────────────────────┘
```

APPARATUS AND METHOD FOR GENERATING A WRITE CURRENT FOR A MAGNETIC MEMORY CELL

FIELD OF THE INVENTION

The invention relates generally to electronic memory. More particularly, the invention relates to an apparatus and method for generating a write current for a magnetic memory cell.

BACKGROUND OF THE INVENTION

Non-volatile memory is memory that retains its content (data) even when power connected to the memory is turned off. Magnetic random access memory (MRAM) is a type of non-volatile memory. MRAM includes storing a logical state, or bit, by setting magnetic field orientations of MRAM cells within the MRAM. The magnetic field orientations remain even when power to the MRAM cells is turned off.

Figure 1:
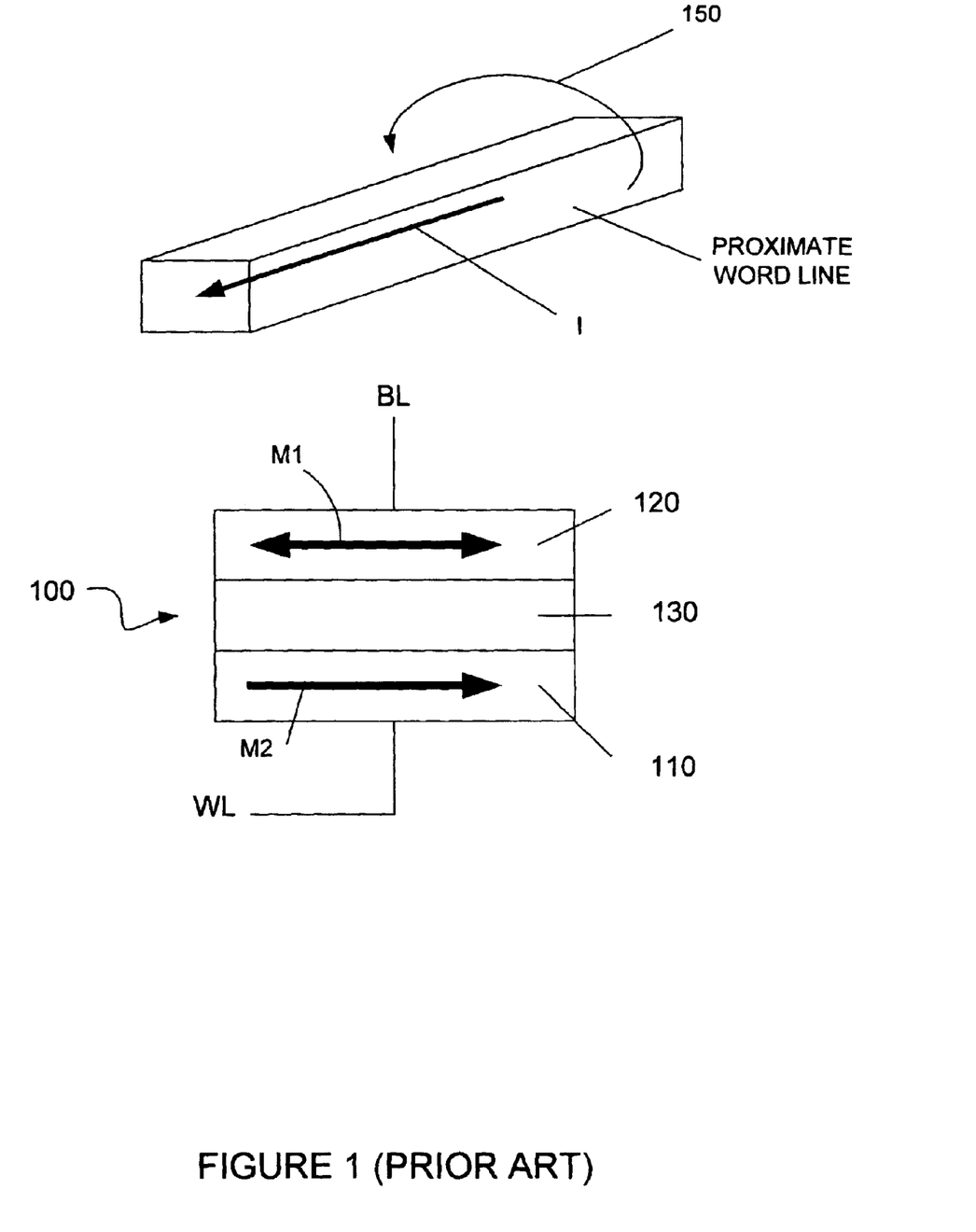
FIG. 1 shows a prior art MRAM memory cell.

FIG. 1 shows an MRAM cell 100. The MRAM memory cell 100 includes a soft magnetic region 120, a dielectric region 130 and a hard magnetic region 110. The orientation of magnetization within the soft magnetic region 120 is non-fixed, and can assume two stable orientations as shown by the arrow M1. The hard magnetic region 110 (also referred to as a pinned magnetic region) has a fixed magnetic orientation as depicted by the arrow M2. The dielectric region 130 generally provides electrical insulation between the soft magnetic region 120 and the hard magnetic region 110.

The MRAM memory cell generally is located proximate to a crossing point of a word line (WL) and a bit line (BL). The word line and the bit line can be used for setting the magnetic state of the memory cell, or for sensing an existing magnetic state of the memory cell. FIG. 1 also includes a proximate word line that can also be used to set the magnetic state of the MRAM memory cell 100. A magnetic field as depicted by the arrow 150 can be induced by a current I flowing through the proximate word line. The induced magnetic field can set the magnetic state of the MRAM memory cell 100.

As previously stated, the orientation of magnetization of the soft magnetic region 120 can assume two stable orientations. These two orientations, which are either parallel or anti-parallel to the magnetic orientation of the hard magnetic region 110, determine the logical state of the MRAM memory cell 100. The soft magnetic region 120 is generally referred to as the sense or data layer, and the hard magnetic region 110 is generally referred to as the pinned or reference layer.

The magnetic orientations of the MRAM memory cells can be set (written to) by controlling electrical currents flowing through the word lines and the bit lines, and therefore, by the corresponding magnetic fields induced by the electrical currents. Because the word line and the bit line operate in combination to switch the orientation of magnetization of the selected memory cell (that is, to write to the memory cell), the word line and the bit line can be collectively referred to as write lines. Additionally, the write lines can also be used to read the logic value stored in the memory cells. The electrical currents applied to the bit line and the word line set the orientation of the magnetization of the data layer depending upon the directions of the currents flowing through the bit line and the word line, and therefore, the directions of the induced magnetic fields created by the currents flowing through the bit line and the word line.

The MRAM memory cells are read by sensing a resistance across the MRAM memory cells. The resistance is sensed through the word lines and the bit lines. Generally, the logical state (for example, a "0" or a "1") of a magnetic memory cell depends on the relative orientations of magnetization in the data layer and the reference layer. For example, in a tunneling magneto-resistance memory cell (a tunnel junction memory cell), when an electrical potential bias is applied across the data layer and the reference layer, electrons migrate between the data layer and the reference layer through the intermediate layer (a thin dielectric layer typically called the tunnel barrier layer). The migration of electrons through the barrier layer may be referred to as quantum mechanical tunneling or spin tunneling. The logic state can be determined by measuring the resistance of the memory cell. For example, the magnetic memory cell is in a state of low resistance if the overall orientation of the magnetization in its data storage layer is parallel to the pinned orientation of magnetization of the reference layer. Conversely, the tunneling junction memory cell is in a high resistance if the overall orientation of magnetization in its data storage layer is anti-parallel to the pinned orientation of magnetization of the reference layer. As mentioned, the logic state of a bit stored in a magnetic memory cell is written by applying external magnetic fields that alter the overall orientation of magnetization of the data layer. The external magnetic fields may be referred to as switching fields that switch the magnetic memory cells between high and low resistance states.

Figure 2:
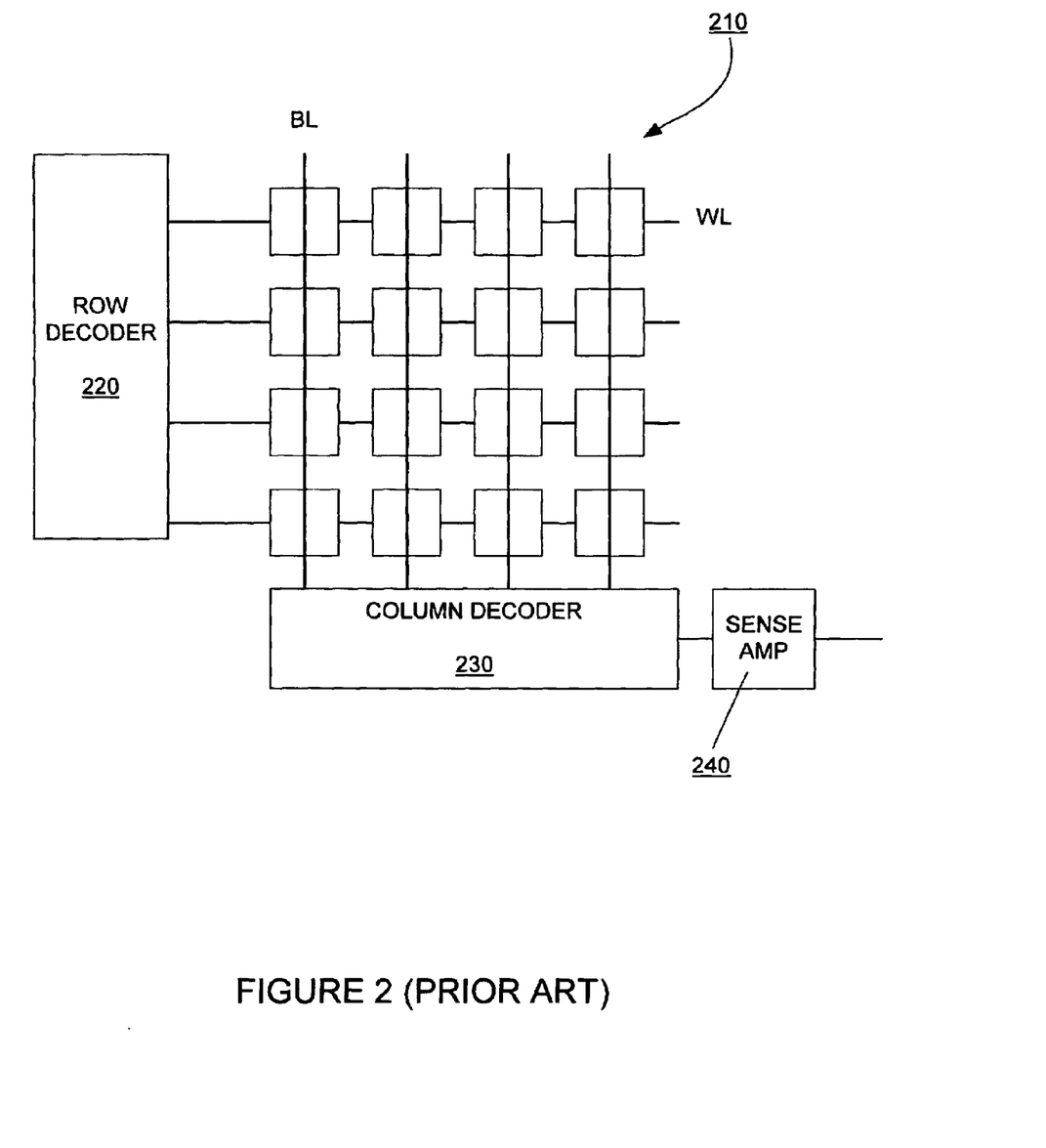
FIG. 2 shows an array of MRAM memory cells.

FIG. 2 shows an array 210 of MRAM memory cells. The logical states of each of the MRAM memory cells can be magnetically set by induced magnetic fields from currents flowing through the bit lines (BL) and word lines (WL). It is critical that the magnetic fields generated by the bit lines (BL) and word lines (WL) be great enough to reliably set the orientation of magnetization of the selected memory cells of the array of MRAM memory cells 210.

Generally, the bit line and word line selections are made through a row decoder 220 and a column decoder 230. The logical states of the memory cells are determined by a sense amplifier 240.

The array 210 of MRAM memory cells can suffer from half-select errors when writing to the memory cells. Memory cells are selected by selecting a particular bit line (BL), and selecting a particular word line (WL). A half-select error occurs when a memory cell associated with a selected bit line and a non-selected word line changes states, or when a memory cell associated with a non-selected bit line and a selected word line changes states. Clearly, half-select errors degrade the performance of MRAM memory.

It is desirable to minimize half-select errors of MRAM memory cells within arrays of MRAM memory cells. Additionally, it is desirable ensure that write operations to the MRAM memory cells be consistent and reliable.

SUMMARY OF THE INVENTION

The invention includes an apparatus and method of writing to magnetic memory cells. The apparatus and method minimizes half-select errors while still providing write operations to the MRAM memory cells that are consistent and reliable.

An embodiment of the invention includes an apparatus for generating a write current for a magnetic memory cell. The apparatus includes a write current generator for generating a write current, the write current being magnetically coupled to the magnetic memory cell. The apparatus further includes at least one test magnetic memory cell, the write current being magnetically coupled to the at least one test magnetic memory cell. A switching response of the at least one test magnetic memory cell determines a magnitude of the write current generated by the write current generator.

Another embodiment of the invention includes a method for determining a write current for a magnetic memory cell. The method includes supplying a test write current to a test magnetic memory cell, sensing a magnetic state of the test magnetic memory cell to determine a switching response of the test magnetic memory cell, and generating the write current having a magnitude that is dependent upon the switching response.

Other aspects and advantages of the present invention will become apparent from the following detailed description, taken in conjunction with the accompanying drawings, illustrating by way of example the principles of the invention.

DETAILED DESCRIPTION

The invention includes an apparatus and method of writing to magnetic memory cells. The apparatus and method minimizes half-select errors while still providing write operations to the MRAM memory cells that are consistent and reliable.

Figure 3:
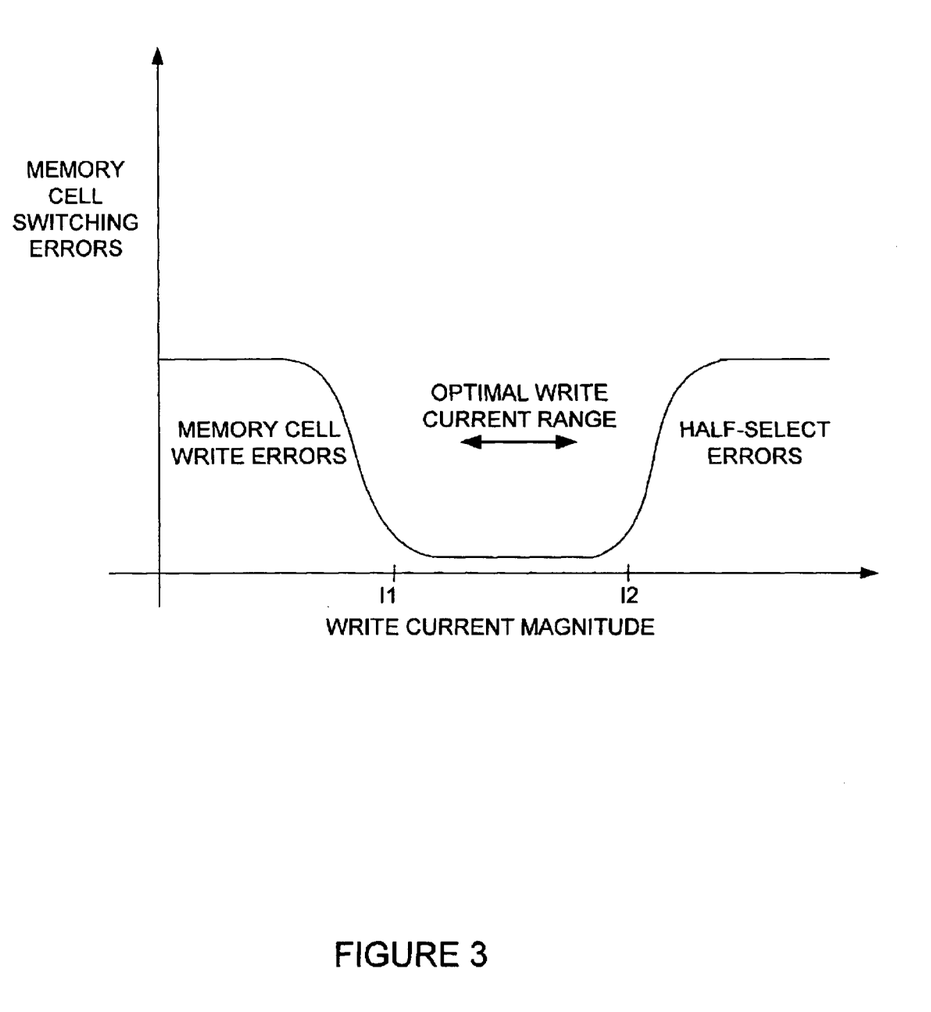
FIG. 3 is a plot showing a relationship between magnetic memory write current and possible memory write errors.

FIG. 3 is a plot showing a relationship between magnetic memory write current and possible memory write errors.

FIG. 3 shows that if the write current to a magnetic memory cell within an array of magnetic memory cells is greater than I2, then magnetic memory cells within the array are likely to suffer from half select errors. As previously described, half-select errors occur when a memory cell associated with a selected bit line and a non-selected word line changes states, or when a memory cell associated with a non-selected bit line and a selected word line changes states. Generally, half-select errors occur when the magnitude of the write current is too large, and more memory cells than the desired memory cell are magnetically induced to change states.

FIG. 3 also shows that when the write current is below I1, then memory cell write errors occur. Basically, when the write current is below a threshold (I1), the magnetic current created by the write current is too small to magnetically write to the memory cell.

As suggested by FIG. 3, there is generally an optimal range of write current for magnetic memory cells within an array of magnetic memory cells. The optimal range is great enough to reliably write to the magnetic memory cell, but low enough not to cause half-select errors to occur within other magnetic memory cells within the array of magnetic memory cells.

Figure 4:
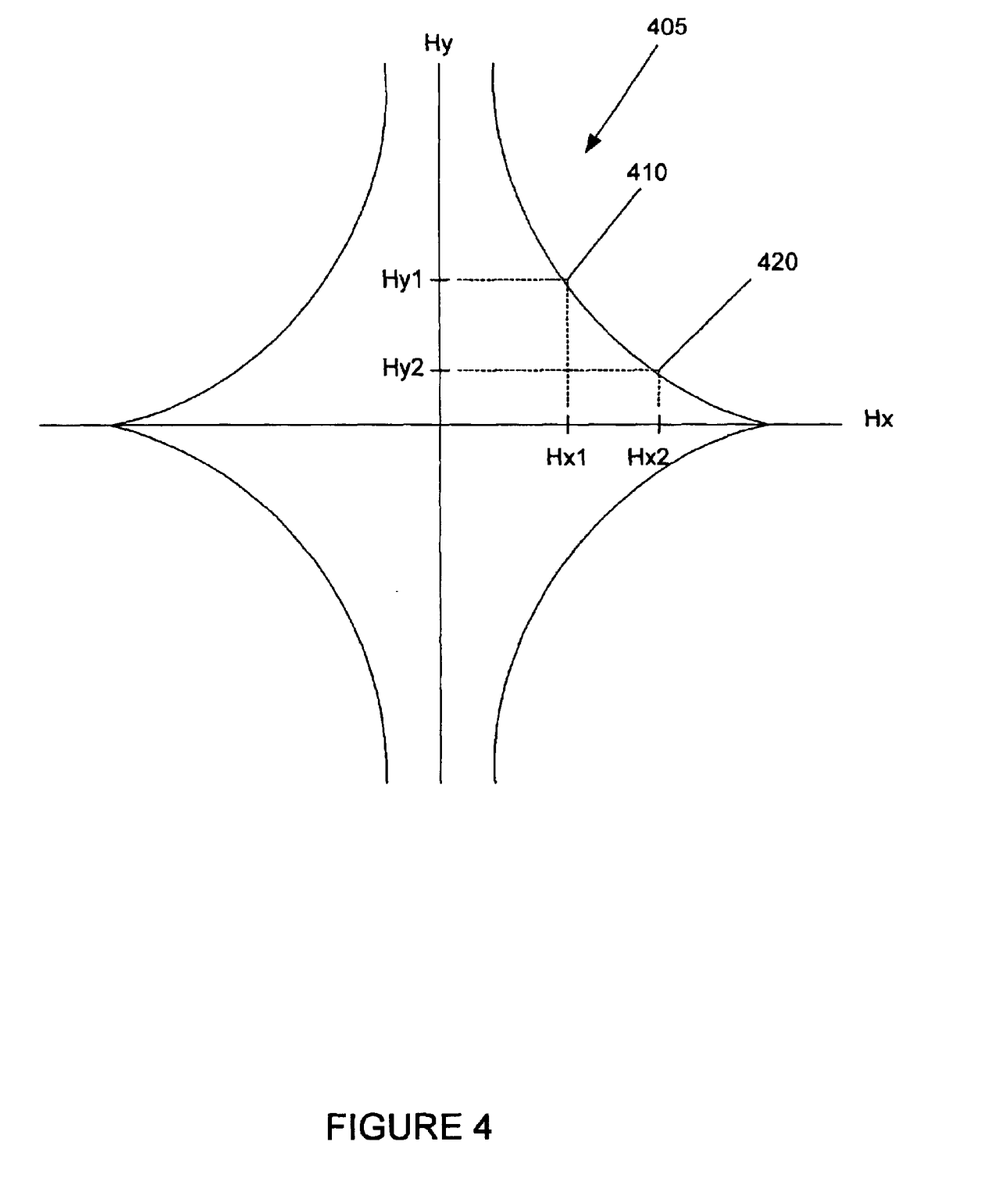
FIG. 4 is a plot showing an intensity of externally applied magnetic fields required to cause an MRAM memory cell to change states.

FIG. 4 is a plot showing an intensity of externally applied magnetic fields required to cause an MRAM memory cell to change state. A first axis is an Hx axis and a second axis is an Hy axis. A magnetic tunnel junction memory cell can generally be physically represented by an X-axis and a Y-axis. Generally, the X-axis of the described magnetic tunnel junction memory cells corresponds with the longest cross-sectional dimension of the magnetic tunnel junction memory cells. Generally, the longest cross-sectional dimension of the magnetic tunnel junction memory cells corresponds with the most stable magnetic orientation of the magnetic tunnel junction memory cells. Therefore, the X-axis of the magnetic tunnel junction memory cells is generally the most stable magnetic orientation of the magnetic tunnel junction memory cells. As a result, two stable magnetic orientations of the magnetic tunnel junction cells generally includes two magnetic orientations as defined by the X-axis of the memory cells.

FIG. 4 shows the magnetic field intensity required to "flip" or change the magnetic orientation of the soft magnetic region of the magnetic memory cell. For example, a first quadrant 405 of the plot of FIG. 4 shows the required Hx magnetic field to cause the MRAM memory cell to change magnetic states for various values of applied Hy magnetic field. A first switch point 410 suggests a first level Hx1 of required Hx magnetic field intensity to change the magnetic state of the memory cell for a first level Hy1 of Hy magnetic filed intensity. A second switch point 420 suggests a second level Hx2 of required Hx magnetic field intensity to change the magnetic state of the memory cell for a second level Hy2 of Hy magnetic filed intensity. The required Hx2 magnetic field intensity of the second switch point 420 is greater than the required Hx1 magnetic field intensity of the first switch point 410.

The Hy, Hx switching characteristics of the magnetic memory cells can be used to minimize half-select errors. More specifically, increasing the Hy magnetic field of a selected memory cell decreases the Hx magnetic field required to write to the magnetic memory cell. Therefore, other non-selected magnetic memory cells within an array of magnetic memory cells that include an Hy magnetic field that is negligible, and therefore, require a greater Hx magnetic field to cause a change in state. Selected memory cells that are physically located between a bit line and word line cross point should include a write current that includes an Hy magnetic field that is as great as is reasonably possible to minimize half-select errors.

The Hy, Hx switching characteristics of the magnetic memory cells can also be used to minimize write errors. More specifically, for a selected Hx, an Hy magnetic field can be selected to ensure that the selected memory cell is properly written. That is, an Hy magnetic field can be selected that guarantees reliable writing to the selected magnetic memory cell. Of course the Hy magnetic field cannot be so great that the above-described half-select errors occur.

Figure 5:
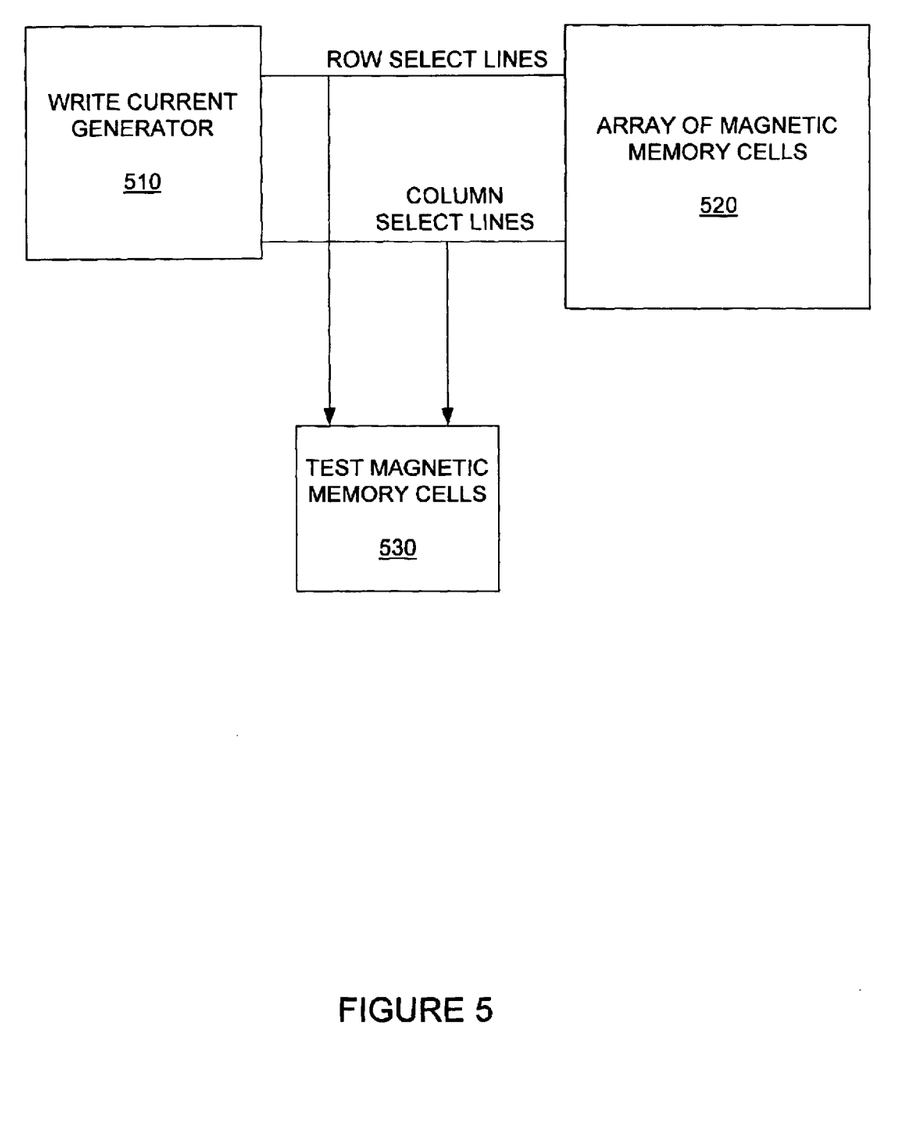
FIG. 5 shows an embodiment of the invention.

FIG. 5 shows an embodiment of the invention. This embodiment includes an apparatus for generating a write current for a magnetic memory cell. A write current generator 510 generates a write current. Depending upon row select lines and column select lines, the write current is magnetically coupled to a selected magnetic memory cell within an array of magnetic memory cells 520.

The embodiment of FIG. 5 includes at least one test magnetic memory cell 530. The write current generated by the write current generator 510 is magnetically coupled to the at least one test magnetic memory cell 520. A switching response of the at least one test magnetic memory cell can be used to determine a magnitude of the write current generated by the write current generator.

The response of the test magnetic memory cell can be used to determine the optimal write current. That is, the response of the test magnetic memory cell can be used to determine the previously described optimal write current range in which the write current is great enough to provide reliable writing to a selected memory cell within the array of magnetic memory cells 520, but small enough that half select errors within the array of magnetic memory cells are minimized.

Figure 6:
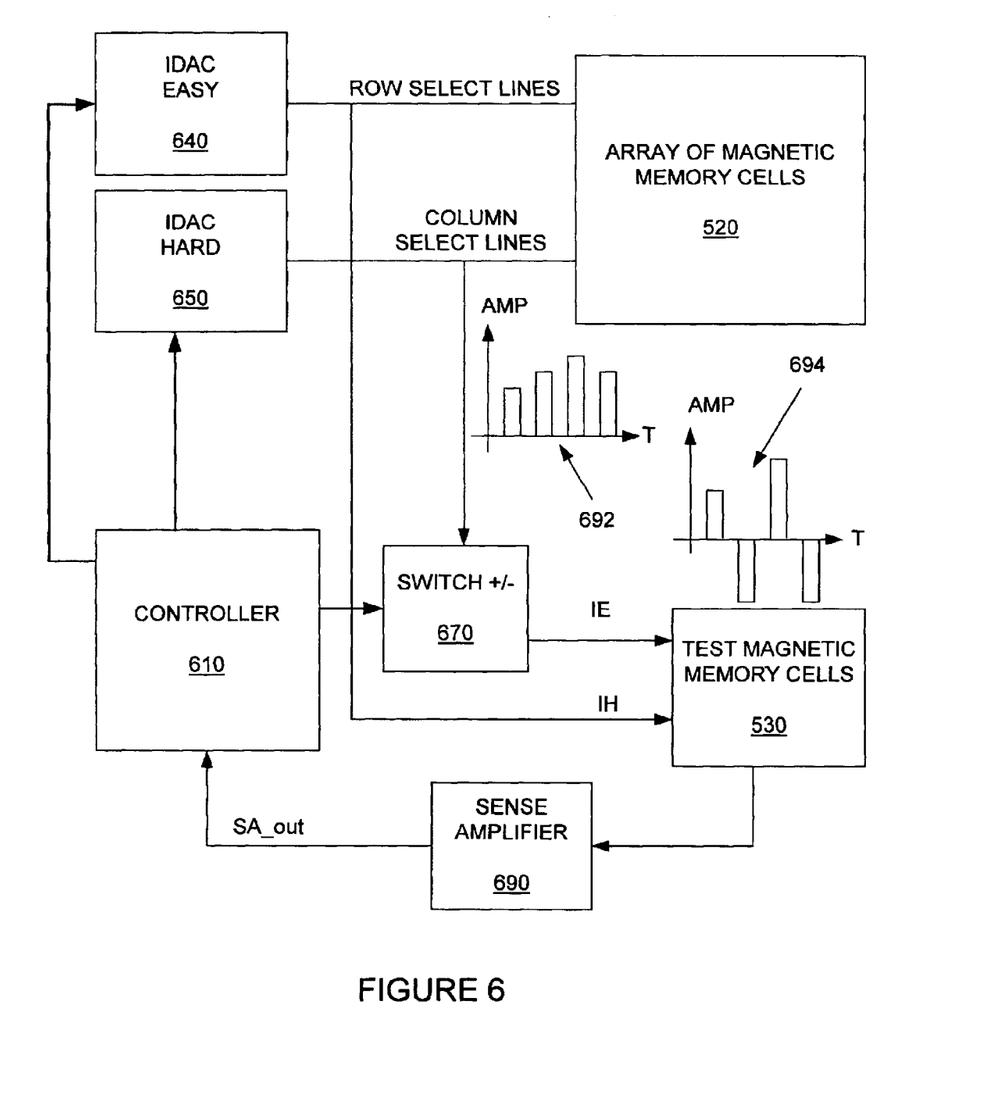
FIG. 6 shows another embodiment of the invention.

FIG. 6 shows another embodiment of the invention. This embodiment shows in greater detail how the optimal write current can be determined. The write current generator 510 of this embodiment includes an easy axis current digital to analog converter (IADC) 640 and a hard axis IADC 650. The easy axis IADC 640 and the hard axis IADC 650 generate a series of pulsed write signals as shown in the plot 692. The pulses are in the form of a current that can induce a magnetic field.

An easy axis switch 670 receives the pulsed write signals (692) of the easy axis IADC 640, and alternates that polarity of the pulses. That is, the easy axis switch 670 generates a switch output that includes the pulsed write signal of the easy axis IADC 640 in which the polarity (positive and negative) of the pulsed signal (shown as 694) alternates from one pulse to the next.

This embodiment does not include a hard axis switch. The uni-polarity pulsed write signals of the hard axis IADC 650 are coupled to the test magnetic memory cells 520.

The alternating polarity pulses of the easy axis IADC 640 and the easy axis switch 670, provide an alternating polarity pulsed magnetic field that is along the easy axis of the test magnetic memory cells 520. The uni-polarity pulses of the hard axis IADC 650 provide a uni-polarity pulsed magnetic field that is along the hard axis of the test magnetic memory cells 520.

A controller 610 provides timing and amplitude control of the easy axis IADC 640 and the hard axis IADC 650. A sense amplifier 690 senses the logical states of the test magnetic memory cells 520. The sense amplifier 690 is connected to the controller, so the controller can determine the logical state of the test magnetic memory cells 520.

A mode of operation of the invention includes the controller setting the hard axis IADC 650 to a default value. The controller then zeroes the easy axis IADC 640, and then increments the easy axis IADC 640 until the controller senses that a test magnetic memory cell has changed its state due to the alternating pulsed magnetic field created by the easy axis IADC 640. The controller then stored this first easy axis IADC 640 value. This represents the minimum easy axis IADC 640 current value required to reliably write to the test magnetic memory cell. The controller then zeroes the hard axis IADC 650. The controller then continues to increment the easy axis IADC 640 value until the test magnetic memory cell has changed its state due to the alternating pulsed magnetic field created by the easy axis IADC 640. The controller then stores this second easy axis IADC 640 value. This represents the maximum easy axis IADC 640 current value. Easy axis IADC 640 values of this magnitude or greater cause half-select errors in non-selected magnetic memory cells. The controller then calculates an easy axis current value that is an average of the first easy axis IADC 640 value and the second easy axis IADC 650 values. The average value represents an easy axis current value that in conjunction with the default hard axis value, minimizes writing errors and half-select errors. The default hard axis IADC 650 value will be described later.

Figure 7:
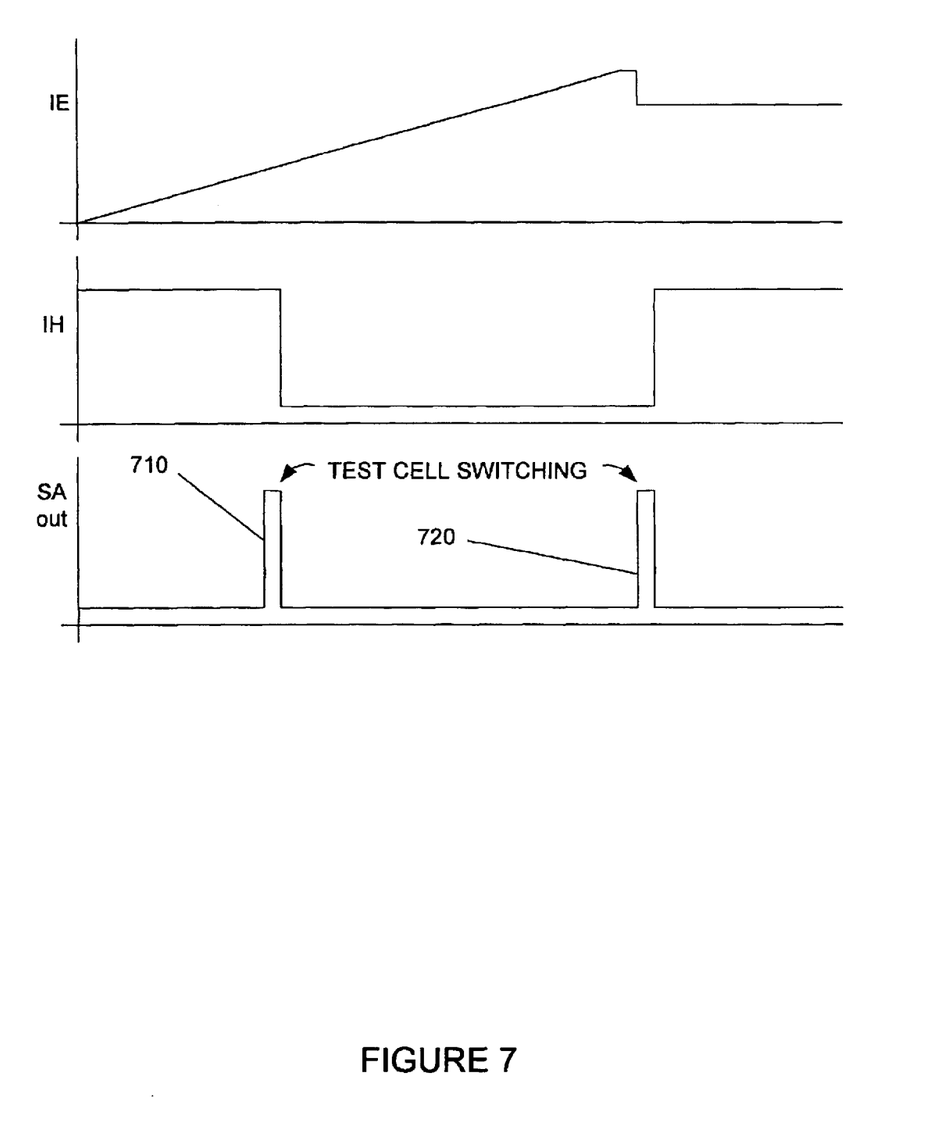
FIG. 7 shows time lines of an easy axis write current and a hard axis write current during initialization.

FIG. 7 shows time lines of an easy axis write current (IE) and a hard axis write current (IH) during initialization. The hard axis write current (IH) is initially set to a default value. The easy axis write current (IE) is ramped up from an initial value of approximately zero. As the easy axis write current (IE) is ramped up, a point will be reached at which the test magnetic memory cell begins to change states. An output signal from the sense amplifier 690 SA_out indicates a change of state of the test magnetic memory cell (point 710 on FIG. 7). Once this point has been obtained, a first value of the easy axis write current (IE) is stored. The first value represents the easy axis write current (IE) required to properly write to the test magnetic memory cell.

The hard axis write current (IH) is then zeroed. The ramping of the easy axis write current (IE) is continued until the output signal from the sense amplifier 690 SA_out again indicates a change of state of the test magnetic memory cell (point 720 on FIG. 7). Once this point has been obtained, a second value of the easy axis write current (IE) is stored. The second value represents the amount easy axis write current (IE) to cause half-select errors to occur.

The hard axis write current (IH) is then switched back to the default value, and the easy axis write current (IE) can then be switched a value equivalent to an average (Iaverage) of the first and second values of the easy axis write current (IE).

Figure 8:
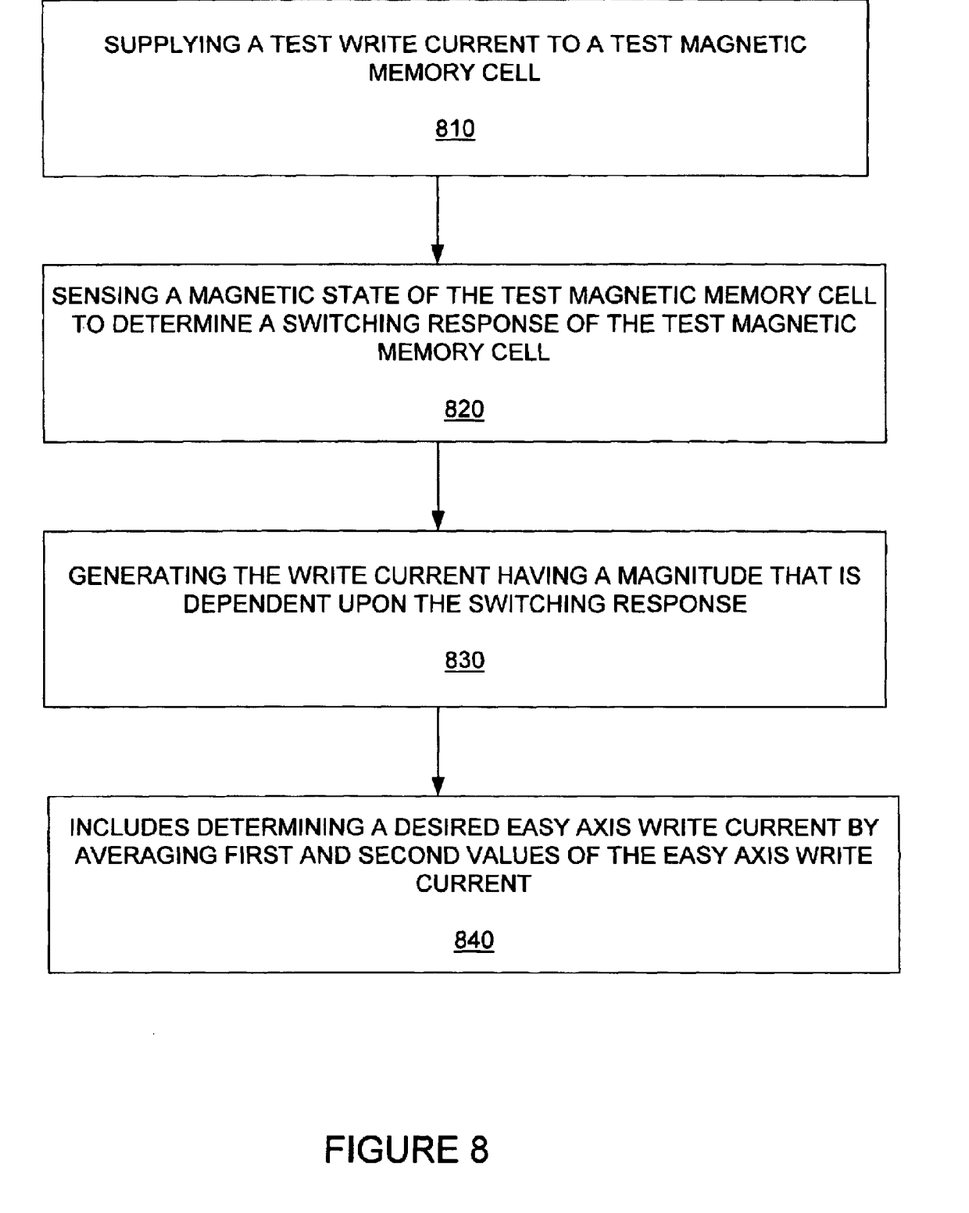
FIG. 8 shows acts included within a method of determining a magnetic memory write current according to an embodiment of the invention.

FIG. 8 shows acts included within a method of determining a magnetic memory write current according to an embodiment of the invention.

A first step 810 includes supplying a test write current to a test magnetic memory cell.

A second step 820 includes sensing a magnetic state of the test magnetic memory cell to determine a switching response of the test magnetic memory cell.

A third step 830 includes generating the write current having a magnitude that is dependent upon the switching response.

A fourth step 840 includes determining a desired easy axis write current by averaging first and second values of the easy axis write current.

Changes in Magnetic Memory Cell Switching

Figure 9:
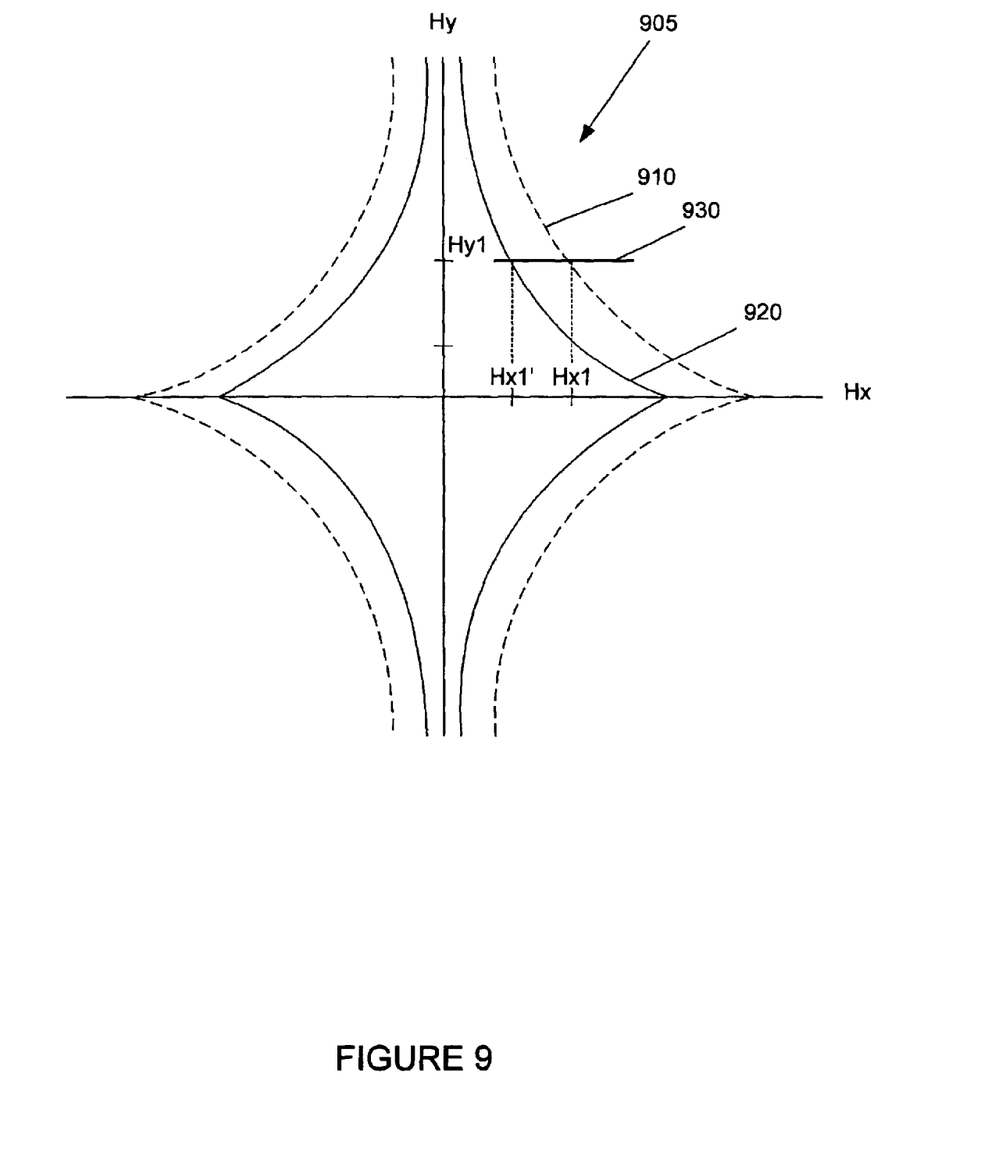
FIG. 9 is a plot showing an intensity of externally applied magnetic fields required to cause an MRAM memory cell to change states, for two different MRAM cell temperatures.

FIG. 9 is a plot showing an intensity of externally applied magnetic fields required to cause an MRAM memory cell to change states, for two different MRAM cell temperatures. A first curve 910 represents the magnetic field intensity required to change or flip the magnetic orientation of a magnetic tunnel junction for a first temperature. A second curve 920 represents the magnetic field intensity required to change of flip the magnetic orientation of a magnetic tunnel junction for a second temperature.

It is to be understood, that changes in the switching curves can be due to other reasons than temperature. For example, the switching curves could also change due to aging.

The effect of temperature on the ability to change to the state of the magnetic tunnel junction can be observed by observing the required Hx magnetic field required to change the state of the magnetic tunnel junctions for a fixed Hy magnetic field as depicted by line 930. As depicted by line 910, for a fixed Hy magnetic field of Hy1, the required Hx magnetic field intensity is Hx1 for the first temperature, and the required Hx magnetic field intensity is Hx1' for the second temperature. Hx1' is less than Hx1 when the second temperature is greater than the first temperature.

Variations in the switching curves of the magnetic memory cells can require that the optimal write current be updated or modified over time or temperature.

Figure 10A:
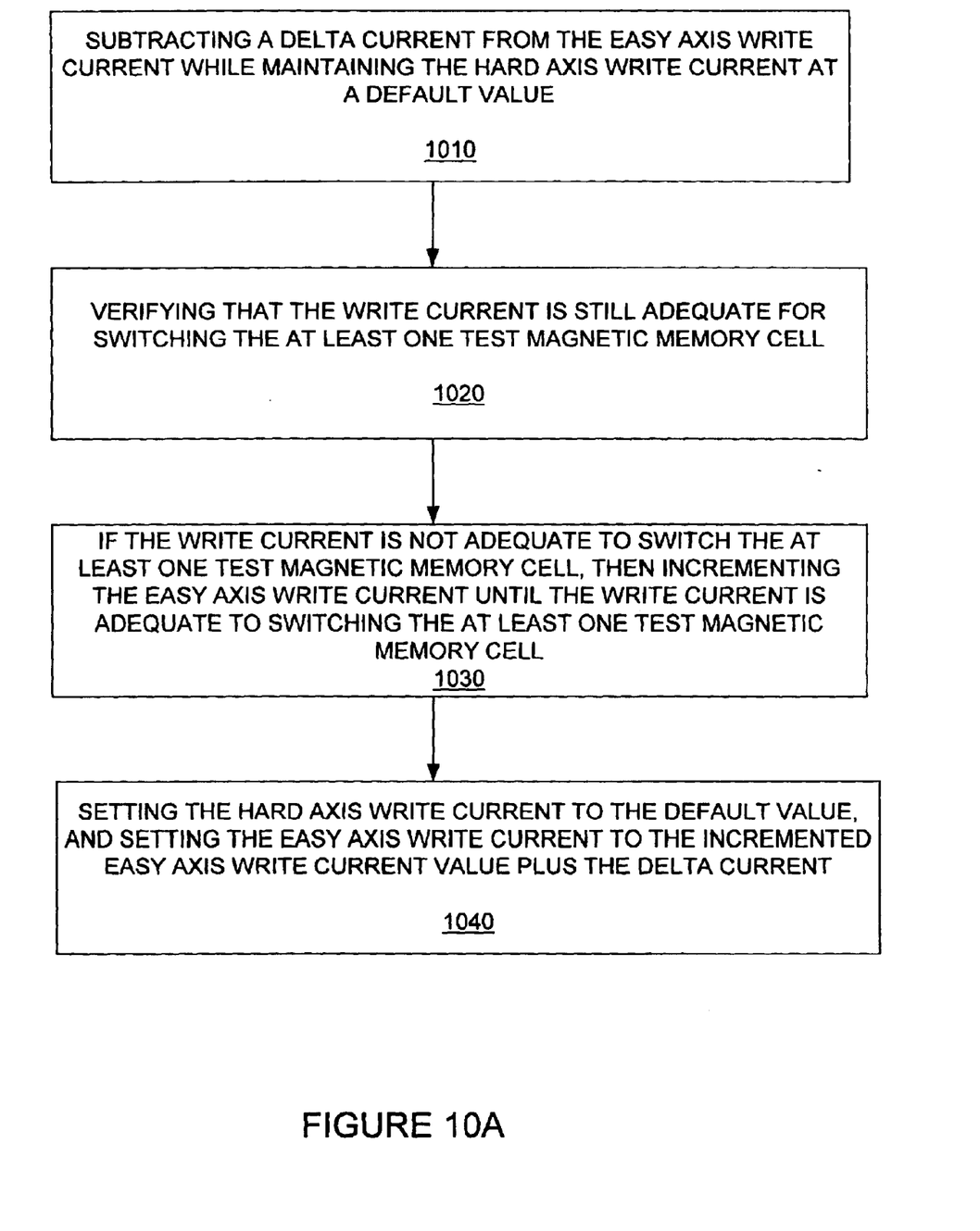
FIG. 10A shows acts included within a method of monitoring a magnetic memory write current according to an embodiment of the invention.

FIG. 10A shows acts included within a method of monitoring a magnetic memory write current according to an embodiment of the invention. The method includes periodically re-calibrating the write current.

A first step 1010 includes subtracting a delta current from the easy axis write current while maintaining the hard axis write current at a default value.

A second step 1020 includes verifying that the write current is still adequate for switching the at least one test magnetic memory cell.

A third step 1030 includes if the write current is not adequate to switch the at least one test magnetic memory cell, then incrementing the easy axis write current until the write current is adequate to switching the at least one test magnetic memory cell.

A fourth step 1040 includes setting the hard axis write current to the default value, and setting the easy axis write current to the incremented easy axis write current value plus the delta current.

Desired values for the default hard axis current, the delta current and the resolution of the increment values can be estimated and characterized depending upon the physical characteristics and materials used in the magnetic memory cells.

Figure 10B:
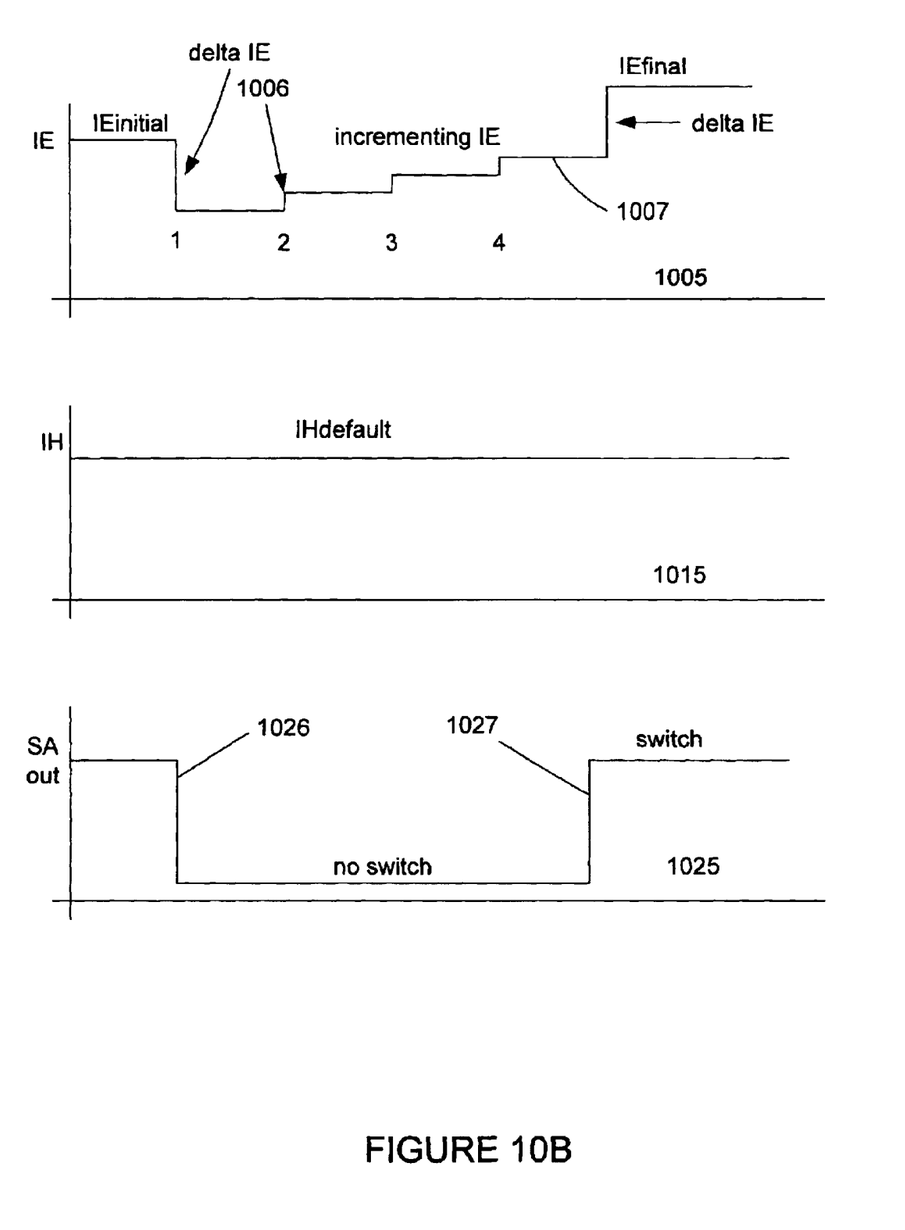
FIG. 10B shows time lines of an easy axis write current and a hard axis write current during a method of write current monitoring.

FIG. 10B shows time lines of an easy axis write current and a hard axis write current during a method of write current monitoring. A first time line 1005 shows the easy axis write current during the method of monitoring the write current. A second time line 1015 shows the hard axis write current during the method of monitoring the write current. A third time line 1025 shows a state (SA_test) of a test magnetic memory cells during the method of monitoring the write current.

The easy axis write current (time line 1005) starts at an initial value. A delta current value is then subtracted from the easy axis current. If the state (SA test) of the test magnetic memory cells stops switching (shown at point 1026 of time line 1025 of FIG. 10B), then the easy axis current is incremented (point 1006). As the easy axis current is incremented, eventually the state of the test magnetic memory cells begins to switch (point 1027). In FIG. 10B, the test magnetic memory cells begin to switch after the fourth (4) increment (point 1007) of the easy axis current. When the test magnetic memory cells begin switching, incrementing of the easy axis current is halted. The delta current value is then added to the easy axis write current.

The method of monitoring a magnetic memory write current of FIGS. 10A, 10B are intended to ensure that the write current is great enough to ensure proper writing of the magnetic memory cells.

Figure 11A:
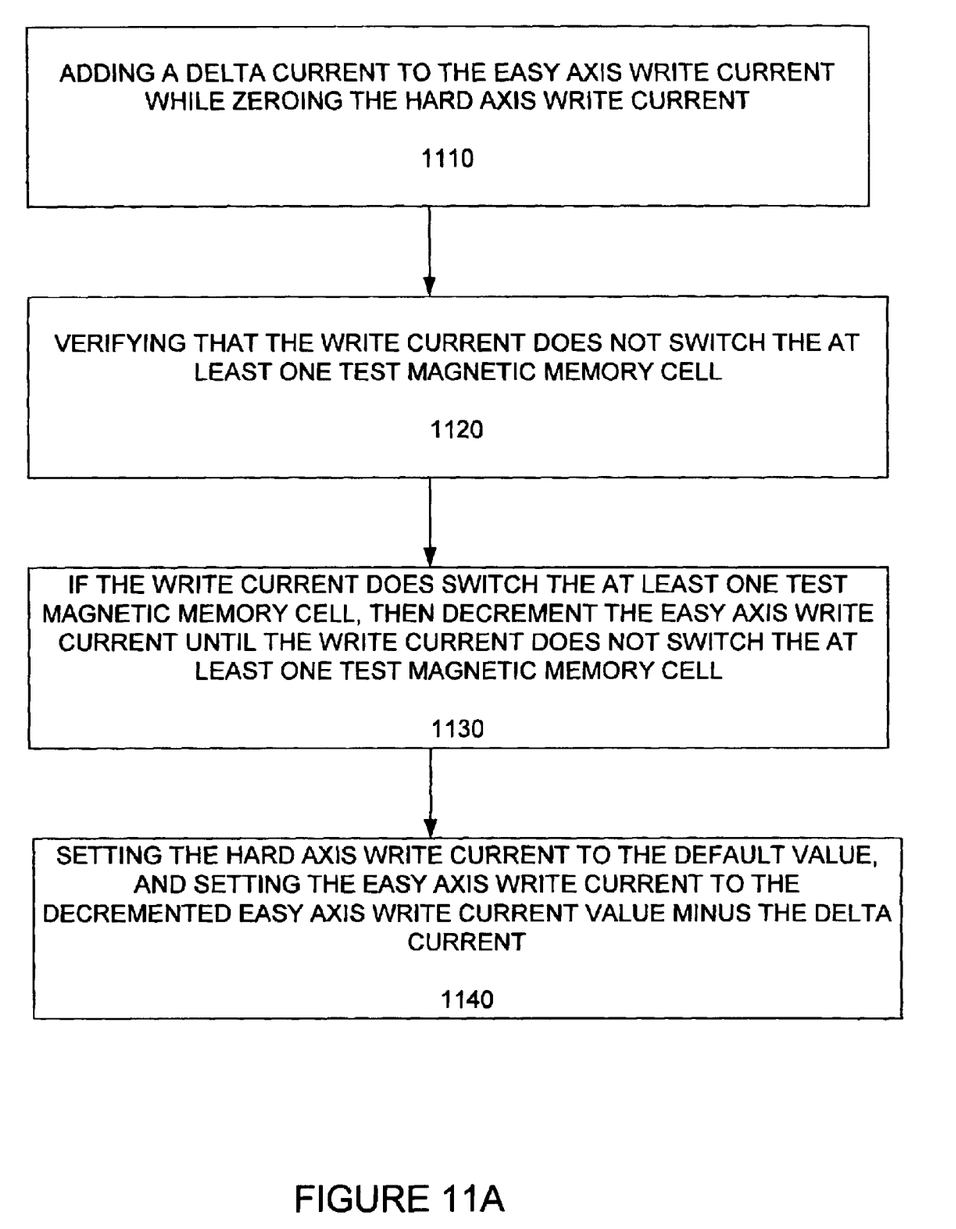
FIG. 11A shows acts included within a method of monitoring a magnetic memory write current according to an embodiment of the invention.

FIG. 11A shows acts included within a method of monitoring a magnetic memory write current according to an embodiment of the invention. Monitoring the write current includes periodically re-calibrating the write current.

A first step 1110 includes adding a delta current to the easy axis write current while zeroing the hard axis write current.

A second step 1120 includes verifying that the write current does not switch the at least one test magnetic memory cell.

A third step 1130 includes if the write current does switch the at least one test magnetic memory cell, then decrement the easy axis write current until the write current does not switch the at least one test magnetic memory cell.

A fourth step 1140 includes setting the hard axis write current to the default value, and setting the easy axis write current to the decremented easy axis write current value minus the delta current.

Desired values for the default hard axis current, the delta current and the resolution of the decrement values can be estimated and characterized depending upon the physical characteristics and materials used in the magnetic memory cells.

Figure 11B:
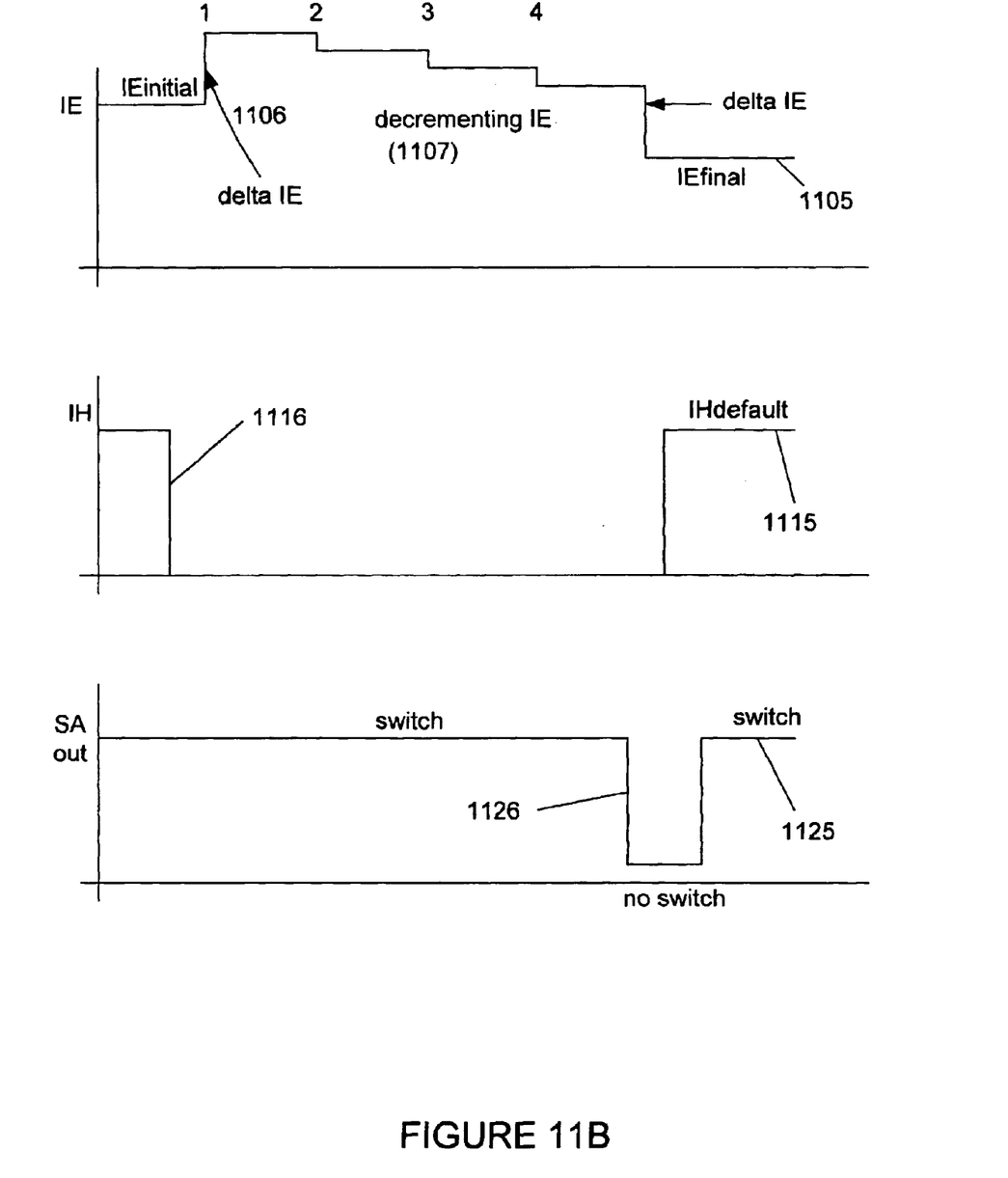
FIG. 11B shows time lines of an easy axis write current and a hard axis write current during a method of write current monitoring.

FIG. 11B shows time lines of an easy axis write current and a hard axis write current during a method of write current monitoring. A first time line 1105 shows the easy axis write current during the method of monitoring the write current. A second time line 1115 shows the hard axis write current during the method of monitoring the write current. A third time line 1125 shows a state of a test magnetic memory cells during the method of monitoring the write current.

The easy axis write current (time line 1105) starts at an initial value. The hard axis write current is set to zero (point 1116 of time line 1115). A delta current value is then added to the easy axis current (point 1106). If the state (SA test) of the test magnetic memory cells does not stop switching (as shown by time line 1125 of FIG. 11B), then the easy axis current is decremented (point 1107). As the easy axis current is decremented, eventually the state of the test magnetic memory cells begins to stop switching (point 1126). In FIG. 11B, the test magnetic memory cells stops switching after the fourth (4) decrement of the easy axis current. When the test magnetic memory cells stops switching, decrementing of the easy axis current is halted. The delta current value is then subtracted from the easy axis write current, and the hard axis write current is set to the default value.

The method of monitoring a magnetic memory write current of FIGS. 11A, 11B are intended to ensure that the write current is small enough to minimize half-select errors when writing to the magnetic memory cells.

Although specific embodiments of the invention have been described and illustrated, the invention is not to be limited to the specific forms or arrangements of parts so described and illustrated. The invention is limited only by the appended claims.

What is claimed:

1. An apparatus for generating a write current for a magnetic memory cell comprising:

a write current generator for generating a write current, the write current being magnetically coupled to the magnetic memory cell;

at least one test magnetic memory cell, the write current being magnetically coupled to the at least one test magnetic memory cell; wherein a switching response of the at least one test magnetic memory cell determines a magnitude of the write current generated by the write current generator.

2. The apparatus for generating a write current of claim 1, wherein the write current being magnetically coupled to the at least one test magnetic memory cell comprises a continuous series of pulses, in which the pulses alternate in polarity.

3. The apparatus for generating a write current of claim 1, further comprising
a test magnetic memory cell state detector for detecting a logical state of the at least one test magnetic memory cell, an output of the test magnetic memory cell state detector being fed back to the write current generator.

4. The apparatus for generating a write current of claim 1, wherein the write current generator comprises an easy axis write current and a hard axis write current.

5. The apparatus for generating a write current of claim 1, wherein the at least one test magnetic memory cell comprises two test magnetic memory cells, reference layers of the two test magnetic memory cells being oriented in opposite directions.

6. The apparatus for generating a write current of claim 4, wherein the write current is at least partially determined by setting the hard axis write current to a default value, and incrementing the easy axis write current until at least one magnetic memory cell switches magnetic orientations, and storing Ieasy1 current value.

7. The apparatus for generating a write current of claim 4, wherein the write current is at least partially determined by setting the hard axis write current to a zero value, and incrementing the easy axis write current until at least one magnetic memory cell switches magnetic orientations, and storing Ieasy2 current value.

8. The apparatus for generating a write current of claim 6, wherein the write current is at least partially determined by setting the hard axis write current to a zero value, and incrementing the easy axis write current until at least one magnetic memory cell switches magnetic orientations, and storing Ieasy2 current value.

9. The apparatus for generating a write current of claim 8, wherein the write current is at least partially determined by averaging the values of the Ieasy1 current value and the Ieasy2 current value.

10. The apparatus for generating a write current of claim 4, wherein the write current is monitored over time.

11. The apparatus for generating a write current of claim 10, wherein monitoring the write current comprises periodically re-calibrating the write current, wherein re-calibrating the write current comprises:
subtracting a delta current from the easy axis write current while maintaining the hard axis write current at a default value;
verifying that the write current is still adequate for switching the at least one test magnetic memory cell; and
if the write current is not adequate to switch the at least one test magnetic memory cell, then incrementing the easy axis write current until the write current is adequate to switching the at least one test magnetic memory cell; and
adding the delta current back to the incremented easy axis current to obtain the re-calibrated write current.

12. The apparatus for generating a write current of claim 10, wherein monitoring the write current comprises periodically re-calibrating the write current, wherein re-calibrating the write current comprises:
adding a delta current to the easy axis write current while zeroing the hard axis write current;
verifying that the write current does not switch the at least one test magnetic memory cell; and
if the write current does switch the at least one test magnetic memory cell, then decrement the easy axis write current until the write current does not switch the at least one test magnetic memory cell; and
subtracting the delta current from the decremented easy axis write current to obtain the re-calibrated write current.

13. The apparatus for generating a write current of claim 10, wherein the write current is re-calibrated upon detection of a predetermined variation in a temperature of the apparatus.

14. A method for determining a write current for a magnetic memory cell, comprising:
supplying a test write current to a test magnetic memory cell;
sensing a magnetic state of the test magnetic memory cell to determine a switching response of the test magnetic memory cell; and
generating the write current having a magnitude that is dependent upon the switching response.

15. The method for determining a write current for a magnetic memory cell of claim 14, wherein the write current generator includes an easy axis write current and a hard axis write current.

16. The method for determining a write current for a magnetic memory cell of claim 15, wherein the write current is at least partially determined by setting the hard axis write current to a default value, and incrementing the easy axis write current until at least one magnetic memory cell switches magnetic orientations, and storing Ieasy1 current value.

17. The method for determining a write current for a magnetic memory cell of claim 16, wherein the write current is at least partially determined by setting the hard axis write current to a zero value, and incrementing the easy axis write current until at least one magnetic memory cell switches magnetic orientations, and storing Ieasy2 current value.

18. The method for determining a write current for a magnetic memory cell of claim 17, wherein the write current is at least partially determined by averaging the values of the Ieasy1 current value and the Ieasy 2 current value.

19. The method for determining a write current for a magnetic memory cell of claim 14, wherein the write current is monitored over time.

20. The method for determining a write current for a magnetic memory cell of claim 19, wherein monitoring the write current comprises periodically re-calibrating the write current, wherein re-calibrating the write current comprises:
subtracting a delta current from the easy axis write current while maintaining the hard axis write current at a default value;
verifying that the write current is still adequate for switching the at least one test magnetic memory cell;
if the write current is not adequate to switch the at least one test magnetic memory cell, then incrementing the easy axis write current until the write current is adequate to switching the at least one test magnetic memory cell; and
adding the delta current back to the incremented easy axis current to obtain the re-calibrated write current.

21. The method for determining a write current for a magnetic memory cell of claim 19, wherein monitoring the write current comprises periodically re-calibrating the write current, wherein re-calibrating the write current comprises:

adding a delta current to the easy axis write current while zeroing the hard axis write current;

verifying that the write current does not switch the at least one test magnetic memory cell;

if the write current does switch the at least one test magnetic memory cell, then decrement the easy axis write current until the write current does not switch the at least one test magnetic memory cell; and subtracting the delta current from the decremented easy axis write current to obtain the re-calibrated write current.

22. The method for determining a write current for a magnetic memory cell of claim 14, wherein the write current is re-determined upon detection of a predetermined variation in a temperature of the apparatus.

23. An array of magnetic memory cells, the array comprising an apparatus for generating a write current for writing to the magnetic memory cells, the apparatus comprising:

a write current generator for generating a write current, the write current being magnetically coupled to the magnetic memory cell;

at least one test magnetic memory cell, the write current being magnetically coupled to the at least one test magnetic memory cell; wherein a switching response of the at least one test magnetic memory cell determines a magnitude of the write current generated by the write current generator.

24. A computing system comprising a central processing unit, and magnetic memory electronically connected to the central processing unit, the magnetic memory comprising an array of magnetic memory cells, the array comprising an apparatus for generating a write for current for writing to the magnetic memory cells, the apparatus comprising:

a write current generator for generating a write current, the write current being magnetically coupled to the magnetic memory cell;

at least one test magnetic memory cell, the write current being magnetically coupled to the at least one test magnetic memory cell; wherein a switching response of the at least one test magnetic memory cell determines a magnitude of the write current generated by the write current generator.

* * * * *